United States Patent
Kim et al.

(10) Patent No.: US 9,520,426 B2
(45) Date of Patent: Dec. 13, 2016

(54) VISION SENSOR CHIP WITH OPEN-LOOP AMPLIFIER, OPERATING METHOD, AND DATA PROCESSING SYSTEM INCLUDING SAME

(71) Applicants: Moo Young Kim, Suwon-si (KR); Yun Hong Kim, Suwon-si (KR); Seok Yong Hong, Seoul (KR); Tae Chan Kim, Yongin-si (KR); Jae Cheol Yun, Seoul (KR)

(72) Inventors: Moo Young Kim, Suwon-si (KR); Yun Hong Kim, Suwon-si (KR); Seok Yong Hong, Seoul (KR); Tae Chan Kim, Yongin-si (KR); Jae Cheol Yun, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 172 days.

(21) Appl. No.: 14/578,639

(22) Filed: Dec. 22, 2014

(65) Prior Publication Data
US 2015/0194454 A1 Jul. 9, 2015

(30) Foreign Application Priority Data
Jan. 8, 2014 (KR) .................. 10-2014-0002552

(51) Int. Cl.
*H01L 27/00* (2006.01)
*H01L 27/146* (2006.01)
(Continued)

(52) U.S. Cl.
CPC ... *H01L 27/14612* (2013.01); *H01L 27/14636* (2013.01); *H01L 27/14638* (2013.01); *H04N 5/335* (2013.01); *H04N 5/378* (2013.01)

(58) Field of Classification Search
CPC .................. H01L 27/146; H01L 27/14612
(Continued)

(56) References Cited

U.S. PATENT DOCUMENTS

| 6,088,467 A | 7/2000 | Sarpeshkar et al. |
| 6,963,060 B2 | 11/2005 | Knee et al. |

(Continued)

FOREIGN PATENT DOCUMENTS

| JP | 5185354 | 1/2013 |
| KR | 20-2010-0000911 | 1/2010 |
| KR | 10-1064495 | 9/2011 |

OTHER PUBLICATIONS

Lichtsteiner, Patrick "A 128×128 120 dB 15 us Latency Asynchronous Temporal Contrast Vision Sensor" IEEE Journal of Solid-State Circuits, vol. 43, No. 2, Feb. 2008.

(Continued)

*Primary Examiner* — Kevin Pyo
(74) *Attorney, Agent, or Firm* — Volentine & Whitt, PLLC

(57) ABSTRACT

A vision sensor chip includes a photoelectric conversion element that generates a current based on an incident light, a current-voltage (I-V) converter that converts the current into a voltage, an AC coupling capacitor directly connected to the I-V converter, an open-loop amplifier that includes a reset switch and amplifies a voltage provided by the I-V converter via the AC coupling capacitor. An event detection block detects motion according to a change in the amplified output voltage and generates first and second detection signals. A reset signal generator generates a reset signal controlling operation of the reset switch in response to first and second control signals respectively related to the first and second detection signals.

20 Claims, 8 Drawing Sheets

(51) Int. Cl.
*H04N 5/335* (2011.01)
*H04N 5/378* (2011.01)

(58) Field of Classification Search
USPC ............... 250/208.1, 214 R, 214 A, 214 SW;
348/300, 301, 307; 382/100, 312
See application file for complete search history.

(56) References Cited

U.S. PATENT DOCUMENTS 7,728,269 B2   6/2010  Lichsteiner et al.
2005/0218299 A1* 10/2005  Olsen ........................ H03F 3/08
                                                        250/214 A
2009/0244345 A1  10/2009  Song et al.

OTHER PUBLICATIONS

Ruedi, Pierre-Francois "A 128×128 Pixel 120-dB Dynamic-Range Vision-Sensor Chip for Image Contrast and Orientation Extraction" IEEE Journal of Solid-State Circuits, vol. 38, No. 12, Dec. 2003.

* cited by examiner

VISION SENSOR CHIP WITH OPEN-LOOP AMPLIFIER, OPERATING METHOD, AND DATA PROCESSING SYSTEM INCLUDING SAME

CROSS-REFERENCE TO RELATED APPLICATIONS

This application claims priority under 35 U.S.C. §119(a) from Korean Patent Application No. 10-2014-0002552 filed on Jan. 8, 2014, the disclosure of which is hereby incorporated by reference in its entirety.

BACKGROUND

Embodiments of the inventive concept relate to vision sensor chips, and more particularly to vision sensor chips including vision sensor pixel(s) having an open-loop amplifier. Other embodiments of the inventive concept relate to operating methods for this type of vision sensor chip and data processing systems including same.

Motion detectors are a class of electronic devices that react in some manner to moving objects. There are many different applications for motion detectors and quite a few are particularly designed to detect the motion of people. That is, one or more motion detector(s) may be integrated into a system specifically designed to automatically detect the motion of people. Generally speaking, a motion detector includes one or more motion sensor(s) that generate an electrical signal (or electrical indication) that corresponds to detected motion.

Certain smart phones, tablet PCs and other electronic devices incorporate (or "embed") one or more motion sensor (s) capable of detecting the motion of people. As with many other components (e.g., integrated circuits) of contemporary portable electronic devices, size is an important consideration. However, in the case of motion sensors embedded in a portable electronic device, size is just one of several particularly important considerations including, for example, sensitivity of the motion sensor, and power consumed by the motion sensor.

In order to reduce the size and power consumption of a motion sensor, it is desirable to reduce the size and number of constituent transistors and capacitors. However, reductions in the physical size of a motion sensor should not materially degrade performance characteristic such as sensitivity.

SUMMARY

Embodiments of the inventive concept provide motion sensors having markedly reduced sizes and including notably fewer and/or smaller constituent transistors and capacitors, as compared with conventional motion sensors. At least in part, these results are accomplished by integrating an open-loop amplifier into the inventive motion sensors.

An embodiment of the inventive concepts is directed to a vision sensor chip, including a photoelectric conversion element that generates current based on an incident light, a current-voltage converter that converts the current into a voltage, an AC coupling capacitor directly connected to an output terminal of the current-voltage converter, an open-loop amplifier which includes a reset switch and amplifies the voltage of the current-voltage converter transmitted through the AC coupling capacitor, an event detection block which detects motion using a change in output voltage of the open-loop amplifier and outputs at least two detection signals, and a reset signal generator which generates a reset signal controlling an operation of the reset switch in response to at least two control signals related to the at least two detection signals.

The current-voltage converter includes a bias circuit which is connected between a first line supplying an operation voltage and the output terminal of the current-voltage converter, a first transistor which is connected between the output terminal of the current-voltage converter and a ground, and includes a gate connected to an output terminal of the photoelectric conversion element, and a second transistor which is connected between a second line and the output terminal of the photoelectric conversion element, and includes a gate connected to the output terminal of the current-voltage converter. The event detection block may generate the two detection signals having the same phase or different phases.

The event detection block includes a switch signal generation circuit which generates two switch signals based on results of comparing each of two threshold voltages having different levels with the output voltage of the open-loop amplifier, and an event detection circuit which generates the at least two detection signals in response to one of the at least two control signals, the reset signal, and the two switch signals.

The event detection block includes a first switch signal generator which compares the output voltage of the open-loop amplifier with a first threshold voltage, and outputs a first switch signal, a second switch signal generator which compares the output voltage of the open-loop amplifier with a second threshold voltage and outputs a second switch signal, and an event detection circuit which generates the at least two detection signals in response to one of the at least two control signals, the reset signal, the first switch signal, and the second switch signal.

The first threshold voltage may be lower or higher than the second threshold voltage. The reset signal generator includes a capacitor, a discharge circuit connected to the capacitor in parallel, and a switch circuit which supplies, in response to one of the at least two control signal, the other of the at least two control signals to the capacitor.

An embodiment of the present inventive concepts is directed to a data processing system, including a vision sensor chip including a plurality of vision sensor pixels, and a processor controlling an operation of the vision sensor chip. Each of the plurality of vision sensor pixels includes a photoelectric conversion element which generates a current based on an incident light, a current-voltage converter which converts the current into a voltage, an AC coupling capacitor directly connected to an output terminal of the current-voltage converter, an open-loop amplifier which includes a reset switch and amplifies the voltage of the current-voltage converter transmitted through the AC coupling capacitor, an event detection block which detects motion using a change in an output voltage of the open-loop amplifier and outputs at least two detection signals, and a reset signal generator which generates a reset signal controlling an operation of the reset switch in response to at least two control signals related to the at least two detection signals.

An embodiment of the present inventive concepts is directed to a method of operating a vision sensor chip, including converting a current generated based on an incident light into a voltage, directly transmitting the voltage to an AC coupling capacitor, amplifying an output voltage of the AC coupling capacitor using an open-loop amplifier including a reset switch, detecting motion using the amplified output voltage and outputting at least two detection signals, and controlling an operation of the reset switch in response to at least two control signals related to the at least two detection signals.

BRIEF DESCRIPTION OF THE DRAWINGS

These and/or other aspects and advantages of the inventive concept will become apparent and more readily appreciated from the following description of the embodiments, taken in conjunction with the accompanying drawings of which.

DETAILED DESCRIPTION OF EMBODIMENTS

Certain embodiments of the inventive concept will now be described in some additional detail with reference to the accompanying drawings. The inventive concept may, however, be embodied in many different forms and should not be construed as being limited to only the illustrated embodiments. Rather, these embodiments are provided so that this disclosure will be thorough and complete, and will fully convey the scope of the invention to those skilled in the art. Throughout the written description and drawings, like reference numbers and labels are used to denote like or similar elements.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that, although the terms first, second, etc. may be used herein to describe various elements, these elements should not be limited by these terms. These terms are only used to distinguish one element from another. For example, a first signal could be termed a second signal, and, similarly, a second signal could be termed a first signal without departing from the teachings of the disclosure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

Figure 1:
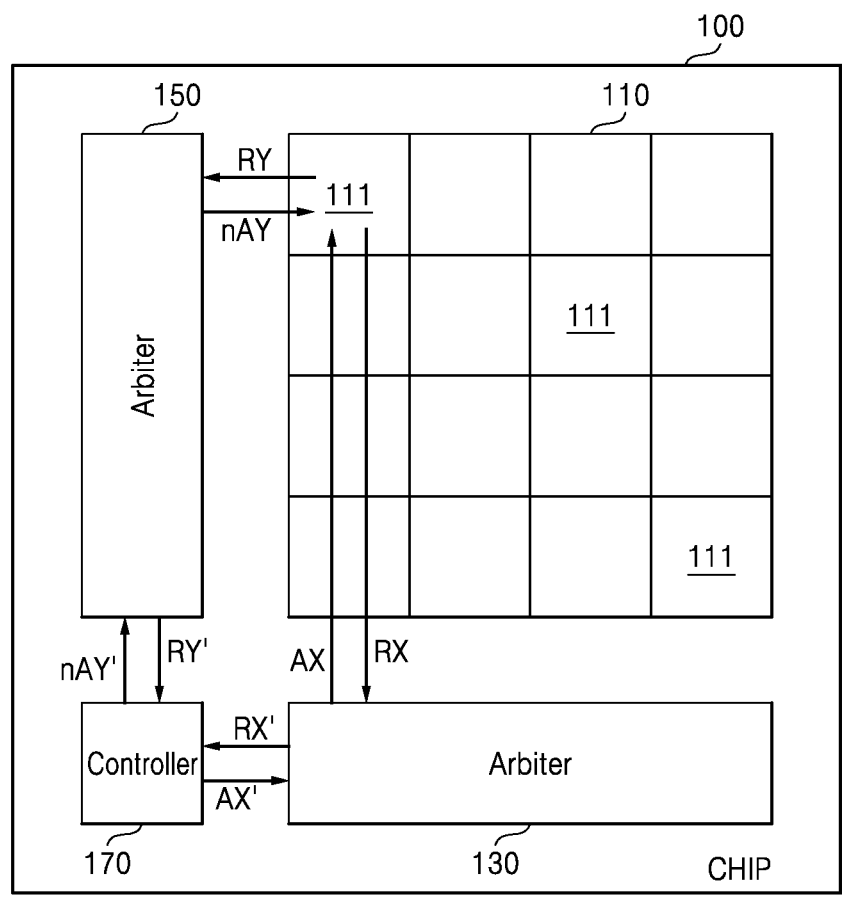
FIG. 1 is a block diagram of a vision sensor chip according to certain embodiments of the inventive concept.

Figure (FIG. 1 is a block diagram of a vision sensor chip 100 according to certain embodiments of the inventive concept. Referring to FIG. 1, the vision sensor chip 100 generally comprises a vision sensor pixel array 110, an X-arbiter 130, a Y-arbiter 150, and a controller 170. In various configurations, the vision sensor chip 100 may be used as a motion detector of the sort that is used to detect the motion of people or similar objects.

The vision sensor pixel array 110 includes a plurality of vision sensor pixels 111. Each vision sensor pixel 111 may be variously embodied and configured to sense (or detect) motion. For example in certain embodiments, each vision sensor pixel 111 may be configured as a dynamic vision sensor (DVS) pixel.

Each vision sensor pixel 111 may sense the motion of object(s), such as one or more person(s), and generate two (i.e., first and second) detection signals RX and RY corresponding to the sensing result. For example, not considering delay(s) caused by signal generation, the two detection signals RX and RY may have the same phase. For convenience of description in relation to FIG. 1 only two detection signals RX and RY are assumed. However, those skilled in the art will recognize that each vision sensor pixel 111 may be designed and operated in other embodiments of the inventive concept to generate more than two detection signals.

In the illustrated embodiment of FIG. 1, the X-arbiter 130 receives the first detection signal RX provided by the vision sensor pixel 111 and generates a corresponding first coordinate signal RX'. This first coordinate signal RX' is provided to the controller 170. In response to the first coordinate signal RX', the controller 170 generates a first vision sensor pixel control signal AX' that is provided to the X-arbiter 130. In response to the first vision sensor pixel control signal AX', the X-arbiter 130 generates a first control signal AX that is provided to the vision sensor pixel 111.

The Y-arbiter 150 receives the second detection signal RY provided by the vision sensor pixel 111 and generates a corresponding second coordinate signal RY' that is provided to the controller 170. The controller 170 generates a second vision sensor pixel control signal nAY' in response to the second coordinate signal RY' and provides it to the Y-arbiter 150.

In certain embodiments, the first coordinate signal RX' may be interpreted as the X coordinate signal of a pair of X and Y coordinate signals, where the second coordinate signal RY' is interpreted as the Y coordinate signal of the pair of X and Y coordinate signals.

In response to the second vision sensor pixel control signal nAY' provided by the controller 170, the Y-arbiter 150 generates a second control signal nAY and provides it to the vision sensor pixel 111. Thus, each of the X-arbiter 130 and Y-arbiter 150 may be configured as an interface circuit between the respective vision sensor pixels 111 and the controller 170 and may inter-operate using various interface signals, such as the signals RX, RX', AX', AX, RY, RY', nAY', and nAY described above.

As will be described in some additional detail hereafter, each vision sensor pixel 111 determines whether or not to reset a constituent open-loop amplifier in response to (e.g.,) the first and second control signals AX and nAY respectively provided by the X-arbiter 130 and Y-arbiter 150 under the control of the controller 170. That is, the controller 170 may be used to generate first and second vision sensor pixel control signals AX' and nAY' respectively based on the first and second coordinate signals RX' and RY'.

In certain embodiments of the inventive concept, the controller 170 may be embodied within (i.e., internally embodied) the vision sensor chip 100. In other embodiments of the inventive concept, the controller 170 may be externally embodied. When the controller 170 is externally embodied, the controller 170 may be embodied as a general processor configured to control the operation of the vision sensor chip 100. (See. e.g., processor 310 of FIG. 6 and processor 510 of FIG. 7).

Figure 2:
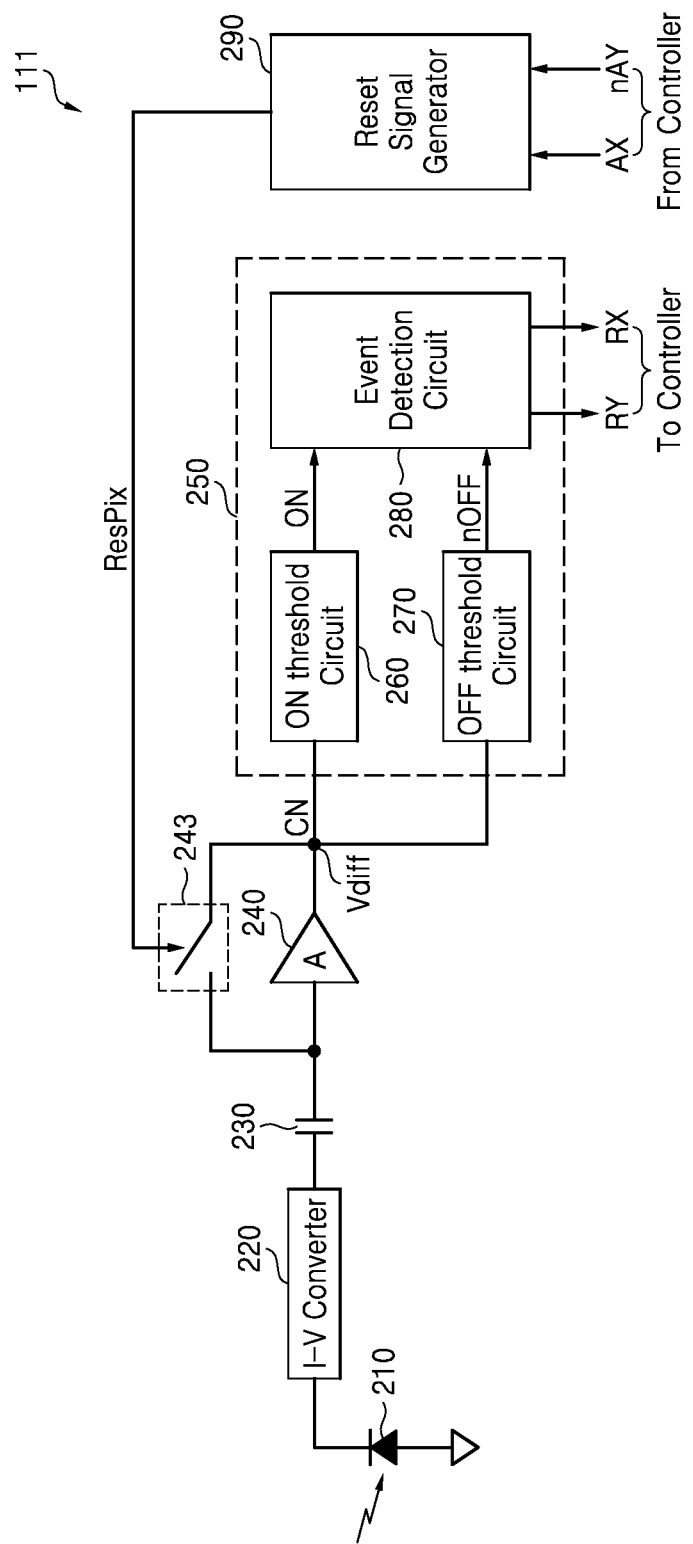
FIG. 2 is a block diagram illustrating in one example the vision sensor pixel 111 of FIG. 1.

FIG. 2 is a block diagram further illustrating in one example the vision sensor pixel 111 of FIG. 1. Referring to FIGS. 1 and 2, the vision sensor pixel 111 comprises a photoelectric conversion element 210, a current-voltage (I-V) converter 220, an alternating current (AC) coupling capacitor 230, an open-loop amplifier 240 configured with a reset switch 243, an event detection block 250, and a reset signal generator 290.

The photoelectric conversion element 210 may be used to generate a current based on an amount of incident light or an intensity of the incident light. The photoelectric conversion element 210 may be embodied as a photo-diode, a photo-gate, a photo-gate transistor, or the like.

The I-V converter 220 may be used to convert the current generated by the photoelectric conversion element 210 into a corresponding voltage. For example, the I-V converter 220 may output a voltage that is proportion with an amount of received current.

The AC coupling capacitor 230 may be directly connected to the output of the I-V converter 220 in order to generate an AC voltage directly corresponding to the voltage output by the I-V converter 220.

The open-loop amplifier 240 may be used to amplify the output voltage provided by the AC coupling capacitor 230 in order to generate an amplified output voltage Vdiff. Thus, the open-loop amplifier 240 may be used to amplify an output voltage provided by the I-V converter 220 as directly transferred by the AC coupling capacitor 230.

The event detection block 250 may be used to detect motion in relation to a change in the level of the amplified output voltage Vdiff provided by the open-loop amplifier 240. Here, first and second detection signals RX and RY corresponding to the detection result will be generated.

The reset signal generator 290 may be used to generate a reset signal ResPix that controls operation of the reset switch 243 in response to the first and second control signals AX and nAY provided by the controller through the X and Y arbiters 150 and 170 in response to the first and second detection signals RX and RY. Accordingly, the open-loop amplifier 240 may be reset by operation of the reset switch 243 in response to a reset signal ResPix.

Figure 3:
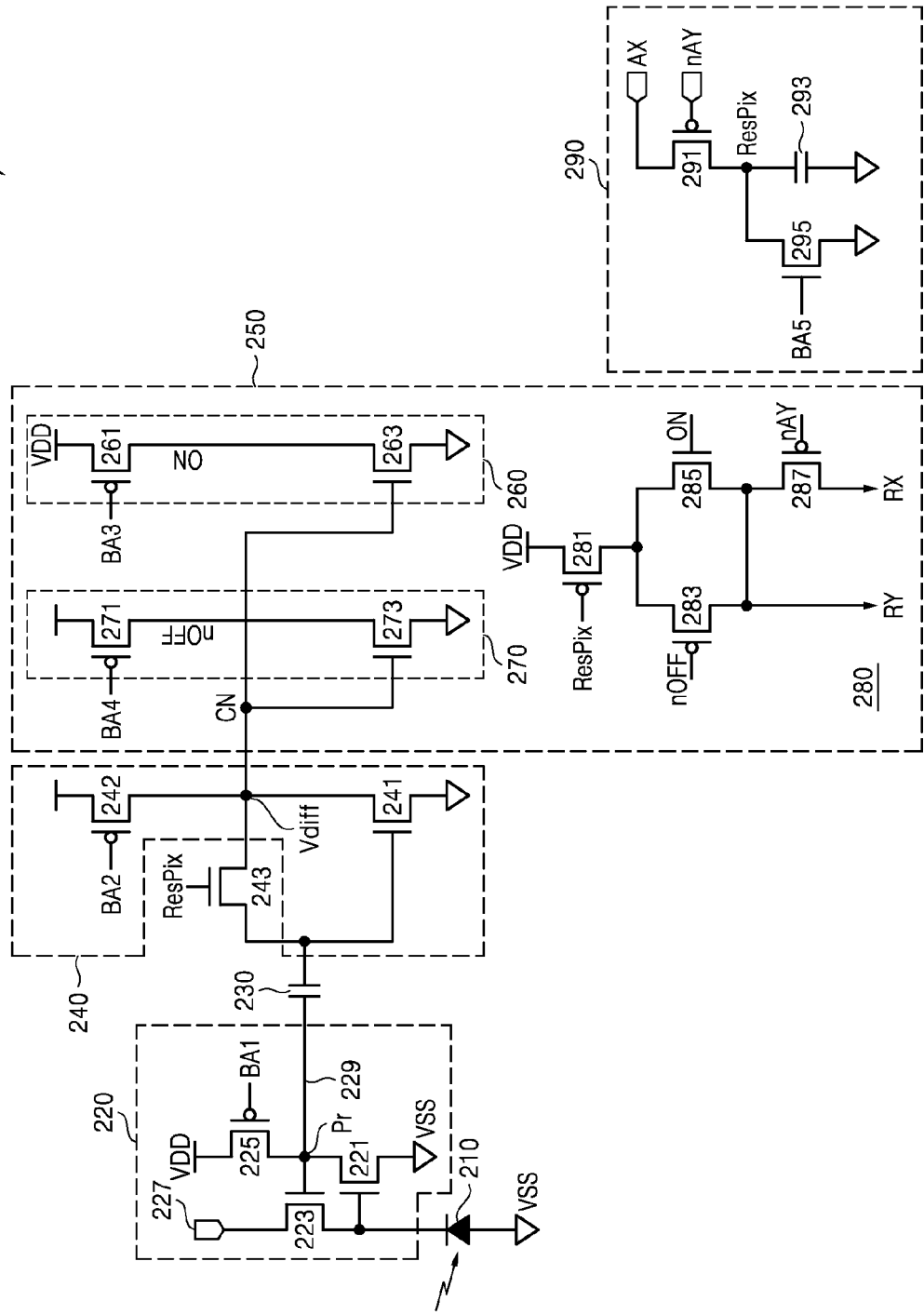
FIG. 3 is a circuit diagram illustrating in one more particular example the vision sensor pixel 111A of FIG. 2.
Figure 4:
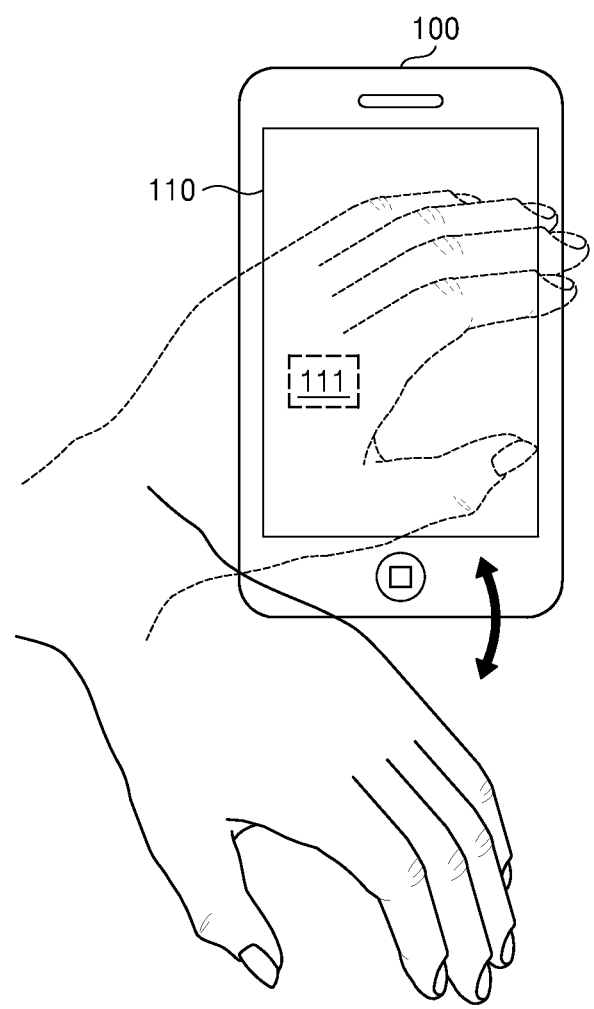
FIG. 4 is a conceptual diagram illustrating one possible method of detecting motion using the vision sensor pixel of FIGS. 2 and 3.
Figure 5:
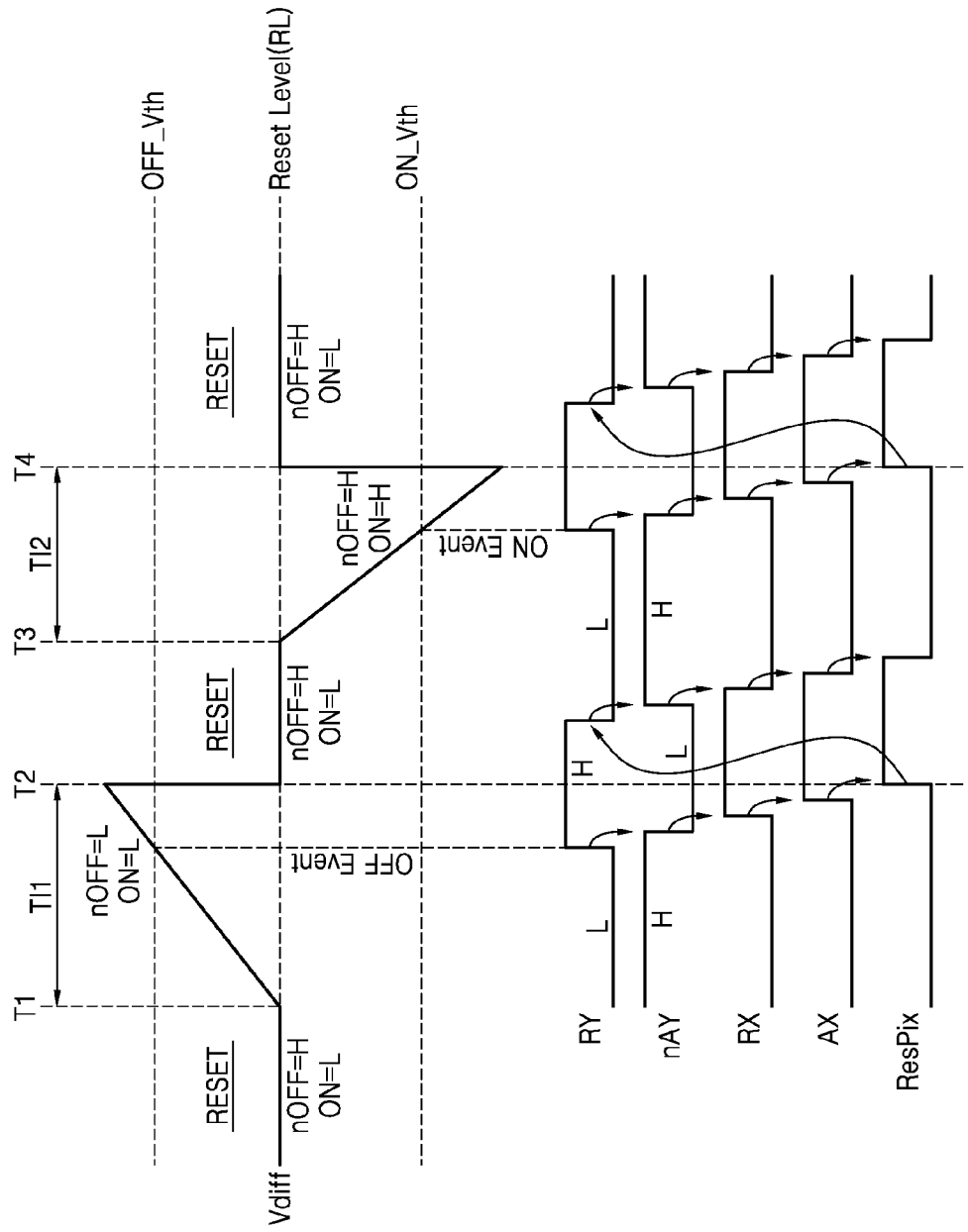
FIG. 5 is a waveform diagram illustrating in one example the output voltage of an open-loop amplifier, as well as levels of certain exemplary operating signals that may be used in relation to the vision sensor pixel of in FIGS. 2 and 3.

FIG. 3 is a circuit diagram further illustrating in one more particular example (111A) the vision sensor pixel of FIGS. 1 and 2. FIG. 4 is a conceptual diagram illustrating a method of detecting motion using the vision sensor pixel of FIG. 3. FIG. 5 is a waveform diagram illustrating the generation of the amplified output voltage by the open-loop amplifier 240, as well as exemplary operating signals that may be used in conjunction with the operation of the vision sensor pixel of FIG. 3. Thus, an exemplary structure and operation of a vision sensor pixel 111A according to an embodiment of the inventive concept will be described in relation to FIGS. 2, 3, 4 and 5.

With reference to FIG. 3, as each bias voltage BA1 to BA5 is supplied, each transistor 225, 242, 261, 271 and 295 will operate as a current source to generate a corresponding bias current. Thus, an amount of current respectively flowing through transistors 225, 242, 261, 271, and 295 may be adjusted according to the respective levels of the bias voltage BA1 to BA5. In the illustrated example of FIG. 3, each bias voltage BA1 to BA5 is assumed to be a direct current (DC) voltage.

The I-V converter 220 of FIG. 3 includes a first bias circuit 225, a first NMOS transistor 221, and a second NMOS transistor 223. The first bias circuit 225 is connected between a first line supplying an operating voltage VDD and an output terminal 229 of the I-V converter 220. The first NMOS transistor 221 is connected between the output terminal 229 of the I-V converter 220 and ground VSS and includes a gate connected to an output terminal of the photoelectric conversion element 210. The second NMOS transistor 223 is connected between a second line 227 and the output terminal of the photoelectric conversion element 210 and includes a gate connected to the output terminal 229 of the I-V converter 220.

In certain embodiments of the inventive concept, the second line 227 may be the same as the first line. In certain other embodiments of the inventive concept, the second line 227 may be a common line connected to a number of vision sensor pixels 111 arranged in the vision sensor pixel array 110.

The event detection block 250 illustrated in FIG. 3 includes a switch signal generation circuit and an event detection circuit 280. The switch signal generation circuit is used to generate an ON switch signal (ON) and an OFF switch signal (nOFF) respectively based on the results of comparing the amplified output voltage Vdiff provided by the open-loop amplifier 240 with two threshold voltages OFF_Vth and ON_Vth having different levels. The illustrated switch signal generation circuit includes an ON-threshold circuit (or a first switch signal generator) 260, and an OFF-threshold circuit (or a second switch signal generator) 270.

Here, the ON-threshold circuit 260 may be used to compare the amplified output voltage Vdiff with a first threshold voltage ON_Vth in order to output a first switch signal ON according to the comparison result. The first switch signal ON may be referred to as an "ON-signal" (ON). The OFF-threshold circuit 270 may be used to compare the amplified output voltage Vdiff with a second threshold voltage OFF_Vth in order to output a second switch signal nOFF according to the comparison result. The second switch signal nOFF may be referred to as an "OFF-signal" (nOFF).

The event detection circuit 280 may be used to generate the first and second detection signals RX and RY in response to at least one (e.g., the second control signal nAY) of the two control signals AX and nAY, the reset signal ResPix, and the ON/OFF signals. The first threshold voltage ON_Vth may be set to be either lower or higher than the second threshold voltage OFF_Vth.

The reset signal generator 290 illustrated in FIG. 3 includes a capacitor 293, a discharge circuit 295 connected in parallel with the capacitor 293, and a switch circuit 291. The capacitor 293 and the discharge circuit 295 form a current discharge path. The discharge circuit 295 may be embodied as an NMOS transistor, and the switch circuit 291 may be embodied as a PMOS transistor.

In response to one (e.g., the second control signal nAY) of the two control signals AX and nAY, the switch circuit 291 may be used to supply the other one (e.g., the first control signal AX) of the two control signals AX and nAY to the capacitor 293.

In a reset state (RESET) of FIG. 5, it is assumed that the ON-threshold circuit 260 outputs the ON-signal (ON) at a logically low level (L) and the OFF-threshold circuit 270 outputs an OFF-signal (nOFF) having a logically high level (H) according to the amplified output voltage (Vdiff) provided by the open-loop amplifier 240. In addition, in the reset state (RESET), it is assumed that each of the signals RY, RX, AX, and ResPix—except the second control signal nAY—is a low. Thus, the amplified output voltage (Vdiff) provided by the open-loop amplifier 240 may be maintained at a reset level (RL) during the reset state (RESET).

During a first time interval (TI1) extending between a first time (T1) and a second time (T2), as the amount (or intensity) of incident light detected by the vision sensor pixel 111 is reduced by the hand passing over the vision sensor pixel 111 in FIG. 2, a corresponding amount of current generated by the photoelectric conversion element 210 gradually decreases. As a result, an output voltage (Pr) generated by the I-V converter 220 gradually decreases according to an operation of NMOS transistor 221 and 223.

The output voltage of the I-V converter 220 is provided to the gate of the NMOS transistor 241 of the open-loop amplifier 240 via the AC coupling capacitor 230. As the output voltage of the I-V converter 220 gradually decreases, an amount of current flowing through the NMOS transistor 241 also gradually decreases. Accordingly, the amplified output voltage Vdiff provided by the open-loop amplifier 240 gradually increases.

When the amplified output voltage Vdiff becomes equal to or greater than the off-threshold (OFF_Vth or second threshold voltage)—that is, when an "OFF Event" occurs—an NMOS transistor 273 of the OFF-threshold circuit 270 is turned ON. Therefore, when an OFF Event occurs, the OFF-signal (nOFF) transitions from high to low while the ON-signal (ON) is maintained low. Here, the on-threshold ON_Vth may indicate a threshold voltage of the NMOS transistor 263, and an off-threshold OFF_Vth may indicate a threshold voltage of the NMOS transistor 273.

When an OFF Event occurs, a PMOS transistor 281 of the event detection circuit 280 is maintained in an ON state when the reset signal ResPix is low. As an NMOS transistor 285 is maintained in an OFF state when the ON-signal (ON) is low, and the OFF-signal (nOFF) transitions from high to low, a PMOS transistor 283 of the event detection circuit 280 is turned ON. Accordingly, the event detection circuit 280 outputs the second detection signal RY at a high level.

The Y-arbiter 150 provides the second coordinate signal RY' corresponding to the second detection signal RY to the controller 170. The controller 170 then outputs the second vision sensor pixel control signal nAY' corresponding to the second coordinate signal RY' to the Y-arbiter 150. The Y-arbiter 150 then generates the second control signal nAY, which transitions from high to low in response to the second vision sensor pixel control signal nAY'. A PMOS transistor 287 of the event detection circuit 280 outputs the first detection signal RX having a high level to the X-arbiter 130 in response to the second control signal nAY having a low level.

The X-arbiter 130 outputs the first coordinate signal RX' corresponding to a first detection signal RX having a high level to the controller 170. The controller 170 then outputs the first vision sensor pixel control signal AX' corresponding to the first coordinate signal RX' to the X-arbiter 130. The X-arbiter 130 then generates the first control signal AX, which transitions from low to high in response to the first vision sensor pixel control signal AX'.

A PMOS transistor 291 of the reset signal generator 290 is maintained in an ON state in response to the second control signal nAY having a low level, such that the first control signal AX having a high level is supplied to the capacitor 293. As the capacitor 293 is charged by the first control signal AX, the reset signal ResPix transitions from low to high. Here, the PMOS transistor 281 is turned OFF in response to the reset signal ResPix having a high level.

The reset switch 243 embodied as an NMOS transistor is connected to an input terminal of the open-loop amplifier 240 and an output terminal (CN) of the open-loop amplifier 240 in response to the reset signal ResPix having a high level. Accordingly, the amplified output voltage Vdiff provided by the open-loop amplifier 240 is reset to the reset level (RL). The foregoing signal waveforms (e.g., RY, nAY, RX, AX, and ResPix) are collectively illustrated in FIG. 5 for convenience of reference.

When the amplified output voltage Vdiff provided by the open-loop amplifier 240 is reset to the reset level (RL), the OFF-signal (nOFF) transitions from low to high, and the OB-signal (ON) is maintained at a low level. When the PMOS transistor 281 is turned OFF in response to the reset signal ResPix having a high level, the second detection signal RY transitions from high to low.

When the second detection signal RY transitions to a low level, the second control signal nAY transitions from low to high. When the second control signal nAY is at a high level, the first detection signal RX transitions from high to low by operation of the PMOS transistor 287, and then the PMOS transistor 291 is turned OFF. As the first detection signal RX transitions to a low level, the first control signal AX transitions from high to low.

As a voltage of the capacitor 293 is discharged through the NMOS transistor 295, the reset signal ResPix transitions from high to low. Accordingly, the event detection circuit 280 outputs the first and second detection signals RX and RY each having a low level. Here, the respective transition timing(s) for the first and second detection signals RX and RY may be determined according to an operational characteristic of the MOS transistors in the event detection block 250 and reset signal generator 290.

During a second time interval (TI2) extending between a third time point (T3) and a fourth time point (T4), as the amount (or intensity) of incident light detected by the vision sensor pixel 111 is increased, a corresponding amount of current generated by the photoelectric conversion element 210 increases, and the output voltage (Pr) generated by the I-V converter 220 gradually increases by operation of the NMOS transistor 221 and 223.

Here again, the output voltage provide by the current-voltage converter 220 is supplied to the gate of the NMOS transistor 241 of the open-loop amplifier 240 via the AC coupling capacitor 230. As an output voltage of the I-V converter 220 gets gradually increases, an amount of current flowing through the NMOS transistor 241 also gradually increases. Accordingly, the amplified output voltage Vdiff provided by the open-loop amplifier 240 gradually decreases.

When the amplified output voltage Vdiff reaches the on-threshold (ON_Vth or the first threshold voltage)—that is when an "ON Event" occurs—the NMOS transistor 263 of the ON-threshold circuit 260 is turned OFF. Accordingly, the ON-signal (ON) transitions from low to high, and the OFF-signal (nOFF) is maintained at a high level.

When the ON Event occurs, the PMOS transistor 281 of the event detection circuit 280 is maintained in the ON state according to the reset signal ResPix having a low level. When the PMOS transistor 283 is maintained in the OFF state according to an OFF-signal (nOFF) having a high level, and an ON-signal (ON) transitions from low to high, the NMOS transistor 285 of the event detection circuit 280 is turned ON. Accordingly, the event detection circuit 280 outputs the second detection signal RY at a high level.

The Y-arbiter 150 outputs the second coordinate signal RY' corresponding to the second detection signal RY having a high level to the coordinate 170. The controller 170 then outputs the second vision sensor pixel control signal nAY' corresponding to the second coordinate signal RY' to the Y-arbiter 150. The Y-arbiter 150 then generates the second control signal nAY that transitions from high to low in response to the second vision sensor pixel control signal nAY'.

The PMOS transistor 287 of the event detection circuit 280 outputs the first detection signal RX having a high level to the X-arbiter 130 in response to the second control signal nAY having a low level.

The X-arbiter 130 outputs the first coordinate signal RX' corresponding to a first detection signal RX having a high level to the controller 170. The controller 170 then outputs the first vision sensor pixel control signal AX' corresponding to the first coordinate signal RX' to the X-arbiter 130. The X-arbiter 130 then generates the first control signal AX that transitions from low to high in response to the first vision sensor pixel control signal AX'.

The PMOS transistor 291 of the reset signal generator 290 is maintained in the ON state in response to the second control signal nAY having a low level, such that the first control signal AX having a high level is supplied to the capacitor 293. As the capacitor 293 is charged by the first control signal AX, the reset signal ResPix transitions from low to high. Here, the PMOS transistor 281 is turned OFF in response to the reset signal ResPix having a high level.

The reset switch 243 embodied as an NMOS transistor is connected to an input terminal of the open-loop amplifier 240 and an output terminal (CN) of the open-loop amplifier 240 in response to the reset signal ResPix having a high level. Accordingly, the amplified output voltage Vdiff provided by the open-loop amplifier 240 is reset to the reset level (RL).

When the amplified output voltage Vdiff is reset to the reset level (RL), the OFF-signal (nOFF) is maintained at a high level, and the ON-signal (ON) transitions from high to low. When the PMOS transistor 281 is turned OFF in response to the reset signal ResPix having a high level, the second detection signal RY transitions from high to low.

When the second detection signal RY transitions to low, the second control signal nAY transitions from low to high. When the second control signal nAY is high, the first detection signal RX transitions from high to low by operation of the PMOS transistor 287, and the PMOS transistor 291 is turned OFF.

As the first detection signal RX transitions to low, the first control signal AX transitions from high to low.

As the voltage of the capacitor 293 is discharged through the NMOS transistor 295, the reset signal ResPix transitions from high to low. Accordingly, the event detection circuit 280 outputs the first and second detection signals RX and RY each having a low level.

When the amplified output voltage Vdiff provided by the open-loop amplifier 240 is reset to a reset level (RL), the OFF signal (nOFF) transitions from low to high, and the ON-signal (ON) transitions to a low level. Accordingly, the event detection circuit 280 outputs the first and second detection signals RX and RY each having a low level.

When each of the first and second detection signals RX and RY is low, the first and second control signals AX and nAY are respectively set to low by the X and Y arbiters 130 and 150 under the control of the controller 170. Accordingly, the reset state of the open-loop amplifier 240 is changed to a set state (i.e., is released), and the open-loop amplifier 240 is made ready to detect a next ON/OFF Event.

As described above, a vision sensor pixel, such as 111 or 111A above, may be used to generate first and second detection signals RX and RY each having a high level whenever motion is detected.

Figure 6:
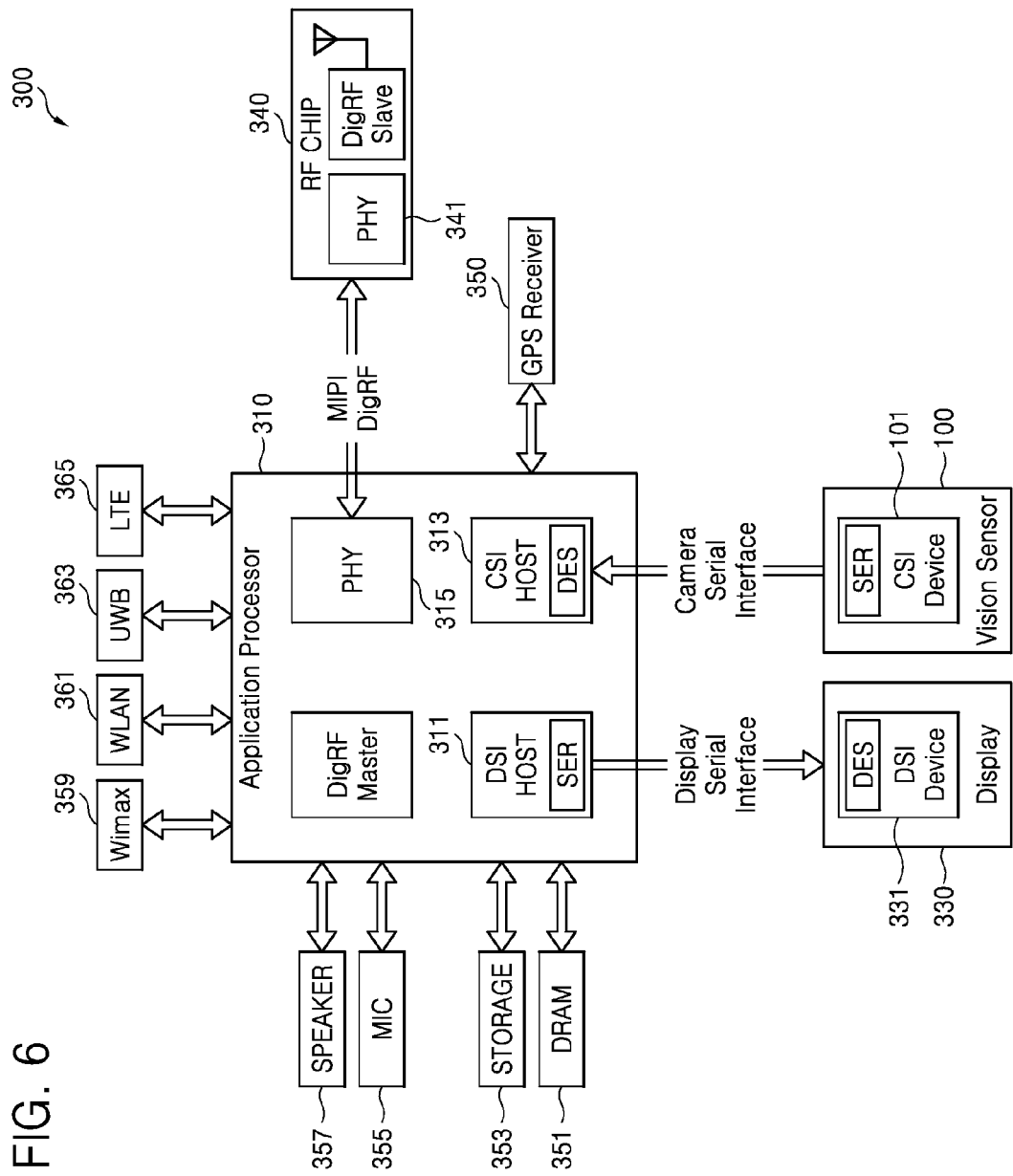
FIGS. 6 and 7 are respective block diagrams of data processing systems that may incorporate a vision sensor chip like the ones illustrated in FIGS. 1, 2 and 3.

FIG. 6 is a block diagram illustrating a data processing system 300 that may be configured to include one or more vision sensor chip(s) like the ones described above in relation to FIGS. 1, 2 and 3. Referring collectively to FIGS. 1, 2, 3, 4, 5 and 6, a data processing system 300 is assumed to be embodied in a portable electronic device supporting a mobile industry processor interface (MIPI®).

The data processing system 300 includes an application processor (AP) 310, a vision sensor chip 100, and a display 330. According to exemplary embodiments, the controller 170 of FIG. 1 may be embodied inside the AP 310 or inside the vision sensor chip 100.

A camera serial interface (CSI) host 313 embodied in the AP 310 may perform a serial communication with a CSI device 101 of the vision sensor chip 100 through a camera serial interface. According to an exemplary embodiment, a deserializer DES may be embodied in the CSI host 313, and a serializer SER may be embodied in the CSI device 101.

A display serial interface (DSI) host 311 embodied in the AP 310 may perform a serial communication with a DSI device 331 of the display 330 through a display serial interface. According to an exemplary embodiment, a serializer SER may be embodied in the DSI host 311, and a deserializer DES may be embodied in the DSI device 331. Each of the deserializer DES and the serializer SER may process an electric signal or an optical signal.

The data processing system 300 may further include a radio frequency (RF) chip 340 which may communicate with the AP 310. A physical layer (PHY) 315 of the AP 310 may transmit or receive data to or from a PHY 341 of the RF chip 340 according to MIPI DigRF.

The data processing system 300 may further include a GPS 350 receiver, a memory 351 such as a dynamic random access memory (DRAM), a data storage device 353 embodied in a non-volatile memory such as a NAND flash-based memory, a mike 355, or a speaker 357.

The data processing system 300 may communicate with an external device using at least one communication protocol or communication standard, e.g., worldwide interoperability for microwave access (WiMAX) 359, a Wireless LAN (WLAN) 361, a ultra-wideband (UWB) 363, or a long term evolution (LTE™) 365.

The data processing system 300 may communicate with an external radio communication device using Bluetooth or WiFi. According to an exemplary embodiment, the AP 310 may further include each configuration element 511, 520, and 540 illustrated in FIG. 6.

Figure 7:
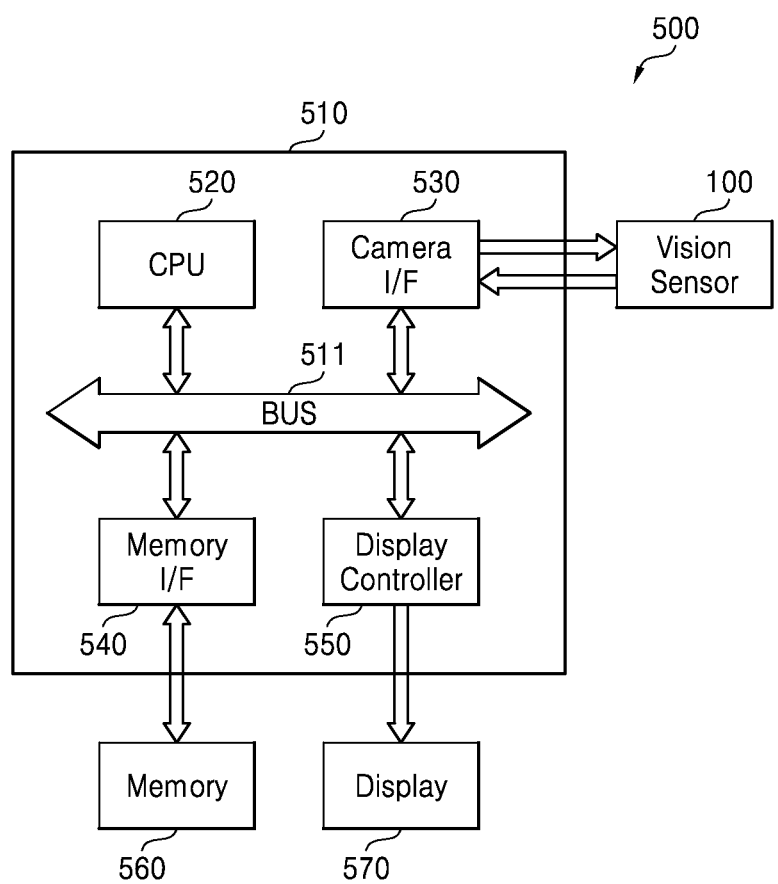

FIG. 7 is a block diagram illustrating another data processing system 500 that may be configured to include one or more vision sensor chip(s) like the ones described above in relation to FIGS. 1, 2 and 3. The data processing system 500 may be embodied in a personal computer (PC), a digital TV, an IPTV, a smart TV, or a portable electronic device. The portable electronic device includes a vision sensor chip 100, and a processing circuit, e.g., a processor, which may include data output from the vision sensor chip 100.

The portable electronic device may be embodied in a smart phone, a table PC, a mobile internet device (MID), a game controller, or a wearable computer. The data processing system 500 may include the vision sensor chip 100, a processor 510, a memory 560, and a display or display device 570.

According to exemplary embodiments, the controller 170 of FIG. 1 may be embodied inside the processor 510 or inside the vision sensor chip 100.

The processor 510 may be embodied in a central processing unit (CPU), an integrated circuit, a system on chip (SoC), an application processor, or a mobile application processor. The processor 510 may control an operation of the vision sensor chip 100, the memory 560, and the display 570, process data output from the vision sensor chip 100, and store the processed data in the memory 560 or display through the display 570.

The processor 510 includes a CPU 520, a sensor interface 530, a memory interface 540, and a display controller 550. The CPU 520 may control an operation of the sensor interface 530, the memory interface 540, and the display controller 550 through a bus 511. The CPU 520 may be embodied in a multi-core processor or a multi-CPU.

According to a control of the CPU 520, the sensor interface 530 may transmit control signals for controlling the vision sensor chip 100 to the vision sensor chip 100, and transmit data output from the vision sensor chip 100 to the CPU 520, the memory interface 540, and/or the display controller 550. The sensor interface 530 may be referred to as a camera interface.

The memory interface 540 may interface data transmitted or received between the processor 510 and the memory 560. The display controller 550 may transmit data to be displayed on the display 570 to the display 570. The memory 560 may be a volatile memory like a DRAM or a flash-based memory. The flash-based memory may be embodied in a multimedia card (MMC), an embedded MMC (eMMC), an embedded solid sate drive (eSSD), or a universal flash memory (UFS).

Figure 8:
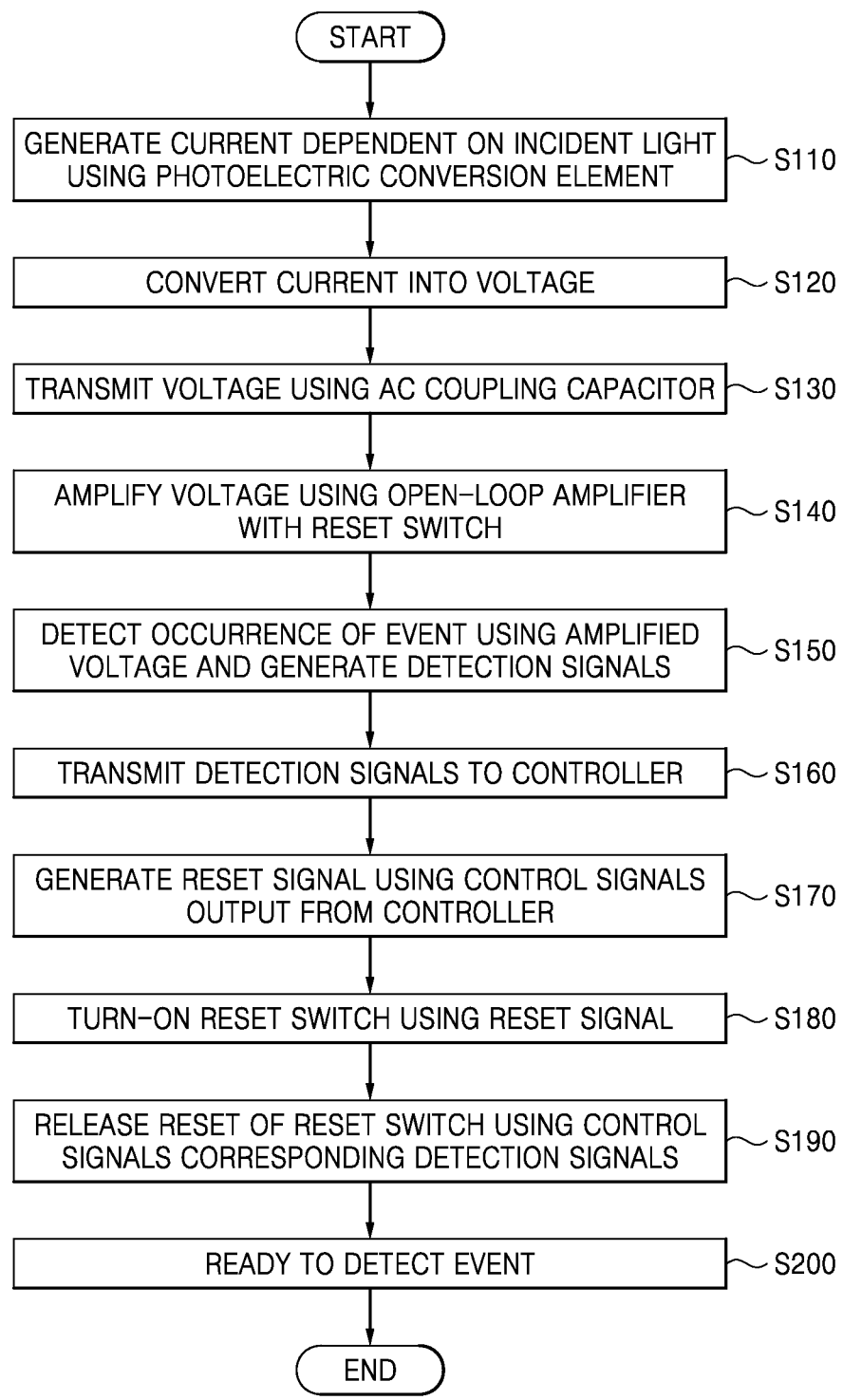
FIG. 8 is a flowchart summarizing in one example the an operating for a vision sensor chip like the ones illustrated in FIGS. 1, 2 and 3.

FIG. 8 is a flowchart summarizing an operating method for a vision sensor chip according to embodiments of the inventive concept. Referring to FIGS. 1, 2, 3 and 8, a I-V converter 220 converts a current generated by the photoelectric conversion element 210 into a corresponding voltage as a function of incident light. That is, the photoelectric conversion element 210 generates a current dependent on an amount of incident light or an intensity of incident light (S110), and the I-V converter 220 then converts the current into a corresponding output voltage (S120).

The output voltage of the I-V converter 220 is directly coupled to the AC coupling capacitor 230, and the output voltage of the AC coupling capacitor 230 is amplified using the open-loop amplifier 240 including the reset switch 243 (S140).

The event detection block 250 then detects motion (i.e., an "Event") in relation to the amplified output voltage Vdiff, and outputs the first and second detection signals RX and RY (S150).

One or more interface circuit(s) communicate the first and second coordinate signals RX' and RY' corresponding to two detection signals RX and RY to the controller 170 (S160). The controller 170 generates first and second vision sensor pixel control signals AX' and nAY' based on the first and second coordinate signals RX' and RY', and transmits the first and second vision sensor pixel control signals AX' and nAY' to the interface circuit(s). The interface circuit(s) then communicate the first and second control signals AX and nAY to the vision sensor pixel 111 based on the first and second vision sensor pixel control signals AX' and nAY'.

The vision sensor pixel 111 generates a reset signal ResPix controlling an operation of the reset switch 243 in response to the first and second control signals AX and nAY related to the first and second detection signals RX and RY (S170).

The reset switch 243 is reset during a short period of time in response to a reset signal ResPix having a high level (S180). The amplified output voltage Vdiff provide by the open-loop amplifier 240 is reset to a reset level (RL). Accordingly, the vision sensor pixel 111 may be made ready to sense a next Event (i.e., detect a next motion).

That is, when a reset operation is released, for example, when the reset signal ResPix transitions from high to low, the first and second detection signals RX and RY may transition a low level.

When the first and second detection signals RX and RY transition to low, the first control signal AX transitions low, and the second control signal nAY transitions high. Accordingly, the reset signal ResPix transitions to low in response to the first and second control signal AX and nAY. That is, the reset signal generator 290 releases the reset state using the reset switch 243 responsive to the first and second control signals AX and nAY corresponding to the first and second detection signals RX and RY (S190). In this manner the vision sensor pixel 111 may be made ready to sense next Event or motion (S200).

A vision sensor pixel according to embodiments of the inventive concept may be provided with a markedly reduced number of transistors and a smaller sized capacitor by use of an open-loop amplifier within the vision sensor pixel. Accordingly, the overall size of the vision sensor pixel, as well as the power consumed by the vision sensor pixel, may be notably decreased. Since the size of the vision sensor pixel may be decreased, resolution of the incorporating vision sensor chip may be may be improved.

Although a few embodiments of the inventive concept have been shown and described in detail, it will be appreciated by those skilled in the art that many changes may be made in these illustrated embodiments without departing from the scope of the inventive concept as defined by the appended claims and their equivalents.

What is claimed is:
1. A vision sensor chip comprising:
   a photoelectric conversion element that generates a current in response to incident light;
   a current-voltage converter that converts the current into a corresponding voltage and provides the corresponding voltage at an output terminal;

an AC coupling capacitor directly connected to the output terminal of the current-voltage converter that receives the corresponding voltage and generates an output voltage;

an open-loop amplifier including a reset switch that amplifies the output voltage to generate an amplified output voltage;

an event detection block that detects motion in relation to a change in the amplified output voltage and generates first and second detection signals; and a reset signal generator that generates a reset signal controlling operation of the reset switch in response to first and second control signals respectively related to the first and second detection signals.

2. The vision sensor chip of claim 1, wherein the current-voltage converter comprises:

a bias circuit connected between a first line supplying an operating voltage and the output terminal of the current-voltage converter;

a first transistor connected between the output terminal of the current-voltage converter and ground and including a gate connected to the photoelectric conversion element; and a second transistor connected between a second line and the photoelectric conversion element and including a gate connected to the output terminal of the current-voltage converter.

3. The vision sensor chip of claim 1, wherein the first and second detection signals have the same phase.

4. The vision sensor chip of claim 3, wherein the first and second control signals have opposite phases.

5. The vision sensor chip of claim 1, wherein the event detection block comprises:

a switch signal generation circuit that generates an ON switch signal and an OFF switch signal respectively based on comparison results between the amplified output voltage and a first threshold voltage and a second threshold voltage having a different level that the first threshold voltage; and an event detection circuit that generates the first and second detection signals in response to one of the first and second control signals, the reset signal, the ON switch signal and the OFF switch signal.

6. The vision sensor chip of claim 5, wherein the switch signal generation circuit comprises:

a ON switch signal generator that compares the amplified output voltage with the first threshold voltage and outputs the ON switch signal; and an OFF switch signal generator that compares the amplified output voltage with the second threshold voltage and outputs the ON switch signal.

7. The vision sensor chip of claim 1, wherein the reset signal generator comprises:

a capacitor;

a discharge circuit connected in parallel with the capacitor; and a switch circuit that in response to one of the first and second control signals supplies the other of the first and second control signals to the capacitor.

8. A data processing system comprising:

a vision sensor chip including vision sensor pixels and a processor controlling operation of the vision sensor chip, wherein each vision sensor pixel comprises:

a photoelectric conversion element that generates a current in response to incident light;

a current-voltage converter that converts the current into a corresponding voltage and provides the corresponding voltage at an output terminal;

an AC coupling capacitor directly connected to the output terminal of the current-voltage converter that receives the corresponding voltage and generates an output voltage;

an open-loop amplifier including a reset switch that amplifies the output voltage to generate an amplified output voltage;

an event detection block that detects motion in relation to a change in the amplified output voltage and generates first and second detection signals; and a reset signal generator that generates a reset signal controlling operation of the reset switch in response to first and second control signals respectively related to the first and second detection signals.

9. The data processing system of claim 8, further comprising:

an X-arbiter configured to receive the first detection signal, generate a corresponding first coordinate signal, and provide the first coordinate signal to the processor, wherein in response to the first coordinate signal the processor generates a first vision sensor pixel control signal and provides the first vision sensor pixel control signal to the X-arbiter, the X-arbiter being further configured in response to the first vision sensor pixel control signal to generate the first control signal; and a Y-arbiter configured to receive the second detection signal, generate a corresponding second coordinate signal, and provide the second coordinate signal to the processor, wherein in response to the second coordinate signal the processor generates a second vision sensor pixel control signal and provides the second vision sensor pixel control signal to the Y-arbiter, the Y-arbiter being further configured in response to the second vision sensor pixel control signal to generate the second control signal.

10. The data processing system of claim 9, wherein the current-voltage converter comprises:

a bias circuit connected between a first line supplying an operating voltage and the output terminal of the current-voltage converter;

a first transistor connected between the output terminal of the current-voltage converter and ground and including a gate connected to the photoelectric conversion element; and a second transistor connected between a second line and the photoelectric conversion element and including a gate connected to the output terminal of the current-voltage converter.

11. The data processing system of claim 8, wherein the first and second detection signals have the same phase.

12. The data processing system of claim 8, wherein the event detection block comprises:

a switch signal generation circuit that generates an ON switch signal and an OFF switch signal respectively based on comparison results between the amplified output voltage and a first threshold voltage and a second threshold voltage having a different level that the first threshold voltage; and an event detection circuit that generates the first and second detection signals in response to one of the first and second control signals, the reset signal, the ON switch signal and the OFF switch signal.

13. The data processing system of claim 12, wherein the switch signal generation circuit comprises:

a ON switch signal generator that compares the amplified output voltage with the first threshold voltage and outputs the ON switch signal; and an OFF switch signal generator that compares the amplified output voltage with the second threshold voltage and outputs the ON switch signal.

14. The data processing system of claim 8, wherein the reset signal generator comprises:

a capacitor;

a discharge circuit connected in parallel with the capacitor; and a switch circuit that in response to one of the first and second control signals supplies the other of the first and second control signals to the capacitor.

15. The data processing system of claim 8, wherein the vision sensor chip and the processor communicate via a camera serial interface (CSI).

16. A method of operating the vision sensor chip, comprising:

converting a current generated based on an incident light into a voltage;

communicating the voltage directly to an AC coupling capacitor;

amplifying an output voltage provided by the AC coupling capacitor using an open-loop amplifier including the reset switch;

detecting motion in relation to a change in the amplified output voltage and generating first and second detection signals in response to the detecting of motion; and controlling operation of the reset switch with first and second control signals respectively related to the first and second detection signals.

17. The method of claim 16, wherein the first and second detection signals have the same phase.

18. The method of claim 17, wherein the first and second control signals have opposite phases.

19. The method of claim 16, wherein the generating of the first and second detection signals comprises:

generating an ON switch signal and an OFF switch signal based by respectively comparing a first threshold voltages with the amplified output voltage, and comparing a second threshold voltage having a level different from the first threshold voltage with the amplified output voltage; and generating the first and second detection signals in response to at least one of the first and second control signals, the reset signal, the ON switch signal, and the OFF switch signal.

20. The method of claim 19, wherein the controlling of the operation of the reset switch comprises:

forming a discharge path using a discharge circuit connected in parallel with the capacitor; and supplying, in response to one of the first and second control signals, the other of the first and second control signals to the capacitor.

* * * * *